United States Patent [19]

Maixner et al.

[11] 4,123,655

[45] Oct. 31, 1978

[54] ARRANGEMENT FOR PREVENTING THE ALTERATION OF THE PRIMARY BEAM BY UNWANTED PARTICLES, SUCH AS SPUTTER PRODUCTS, CHARGED IONS AND ELECTRONS AND THEIR SECONDARY PROCESSES

[75] Inventors: Uwe Maixner, Barum; Dieter Milferstädt, Tespe-Bütlingen, both of Fed. Rep. of Germany

[73] Assignee: Gesellschaft für Kernenergieverwertung in Schiffbau und Schiffahrt mbH, Geesthacht-Tesperhude, Fed. Rep. of Germany

[21] Appl. No.: 827,307

[22] Filed: Aug. 24, 1977

[30] Foreign Application Priority Data

Aug. 30, 1976 [DE] Fed. Rep. of Germany ....... 2639033

[51] Int. Cl.$^2$ ............................................. H01J 39/00
[52] U.S. Cl. ................................... 250/305; 250/457; 250/492 R
[58] Field of Search .................... 250/492 B, 306, 309, 250/310, 457, 526, 305, 492 R Primary Examiner—Harold A. Dixon
Attorney, Agent, or Firm—Walter Becker

[57] ABSTRACT

An arrangement relating to the prevention of the alteration of the primary beam by unwanted particles, such as sputter products, charged ions and electrons and their secondary processes, and to the resulting local improvement in the operational vacuum in electron-beam devices, ion-beam devices and in electron-energy analyzers and ion-mass analyzers using only three-dimensional metallic microstructures known as particle traps. Substantially all the flat parts of the components of the instrument seen by the beams, such as electrodes, diaphragms, screening plates, housing walls and the like, consist of a metal having a low atomization rate and a very low desorption rate, such as titanium or zirconium or similar substances and their alloys. Apertures of less than 0.5 mm in diameter, situated close beside one another and extending substantially perpendicular to the surface, are provided in the surfaces of the components of the instrument, between which apertures a lattice structure remains located in the surface, the depth of the apertures being equal to or larger than their opening cross-section and the total cross-sectional area of the apertures corresponding to at least half the metal surface occupied thereby.

10 Claims, 5 Drawing Figures

ARRANGEMENT FOR PREVENTING THE ALTERATION OF THE PRIMARY BEAM BY UNWANTED PARTICLES, SUCH AS SPUTTER PRODUCTS, CHARGED IONS AND ELECTRONS AND THEIR SECONDARY PROCESSES

The invention relates to an arrangement for preventing alteration of the primary beam by unwanted particles, such as sputter products, charged ions and electrons and their secondary processes and to the resulting local improvement in operational vacuum in electron-beam devices, ion-beam devices and in electron-energy analyzers and ion-mass analyzers using only three-dimensional metallic microstructures known as particle traps.

The previously known devices, acting exclusively as particle traps, for such beams present in evacuated vessels consist of a sponge-like sintered metal or graphite structure which is applied, for example, to the anode of an electron tube. This involves the disadvantage, however, that the very large surface of the particle trap, which is desirable in itself, can only be degassed with difficulty and naturally has too large an internal labyrinth surface which cannot be used as particle trap and thus is superfluous. In devices in which such particle traps are installed, a very good operational vacuum is required in order to exclude disturbing effects as a result of residual gas which is otherwise present. In addition, the irregular surface of these above-mentioned structures involves the risk of field distortion.

It is, therefore, an object of the present invention to eliminate the above-mentioned disadvantages and to solve the following problems:

1. The development of the various emitted particles should be drastically restricted.
2. The corresponding components of the various devices should be so constructed that they cooperate as an active system improving the vacuum by the influence of the beam current in its interaction region.
3. The residual emissions should be trapped to a greater extent than hitherto.
4. Local field distortions as a result of projecting surface portions should be avoided.
5. Local charging regions as a result of the formation of insulating oxide layers should be avoided.
6. The vaporization of insulator surfaces by sputter products should be avoided.

These and other objects and advantages of the invention will appear more clearly from the following specification in connection with the accompanying drawings, in which:

FIG. 1 diagrammatically shows an electron-energy analyzer as one of the fields of application of the invention.

Figure 1:
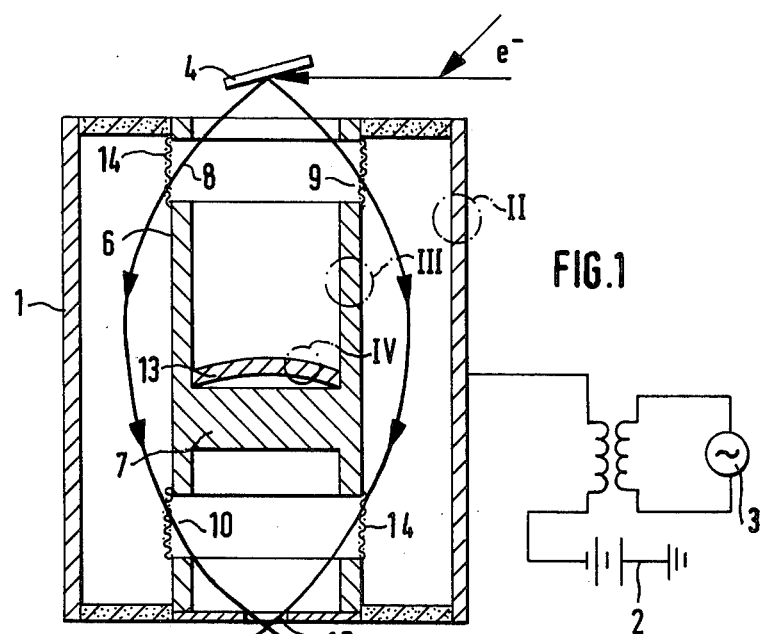

The electron or ion beam instrument according to the invention is characterized primarily in that substantially all flat parts of the instrument components of the device seen by the rays, such as electrodes, diaphragms, screening plates, housing walls and the like, consist of a metal having a low atomization rate and a very low desorption rate, such as titanium or zirconium or similar materials and their alloys, and that apertures of less than 0.5 mm diameter, which are situated close together and extend substantially perpendicular to the surface are provided in the surfaces of the components of the instrument. Between said apertures there remains a lattice structure located in the surface. The depth of the apertures is equal to or greater than their opening cross-section, and the whole cross-sectional area of the apertures corresponds to at least half of the metal surface occupied thereby.

Since the said materials and their natural surface have a low atomization rate and a very low desorption rate, the surface coatings and surface layers, which are scarcely still vaporized or atomized on the impact of the beams, are not emitted but migrate into the metal. Furthermore, since the said metals have a very low secondary electron emission of less than "1", less than one further secondary particle is emitted on the impact of a primary particle or (corresponding to a ping-pong effect) secondary particle. It is also significant that now, according to the invention, all the surfaces seen by the beam, act as an active system improving the vacuum and as a result are effective primarily locally where the best operating conditions are needed, namely along the region of the primary beam.

The apertures are either blind holes or through-bores which do not distort and alter the radiation field and so do not in any way have an adverse effect on the field characteristics of the apparatus equipped with such an instrument. Blind holes are always used when the absorbed particles should not pass through to the back of the material. Particularly satisfactury results can be achieved if the recesses occupy about 65 to 85% of the surface of the device. In view of multiple reflections of the secondary electrons in the apertures, it is an advantage if these apertures converge in the direction of incidence of the rays. Such recesses can be produced in a particularly simple manner by electron-beam or laser-beam perforation. With this production, the ray inlets are necessarily slightly larger than the ray outlets.

Experience with the present invention has shown that, with a mass spectrometer for example, a very considerable increase in the measuring sensitivity can be achieved. The result depends partly on the fact that in the instruments used hitherto, an operational vacuum originally prevailing in the interior of the mass spectrometer, for example, is locally very considerably impaired by the desorbing action of the electron-ion beam. A deterioration in the vacuum hitherto occurred in the region of the separating electrode as a result of the secondarily emitted particles and in particular as a result of the vaporized (desorbed) residual gas.

The arrangement according to the invention can be used to advantage, for example for electron guns for welding, drilling, perforating etc., precision electron-beam micro-oscillographs, electron accelerators, television camera tubes, electron-beam microprobes, electron microscopes, raster electron microscopes, electron energy analyzers, ion guns for working material, ion guns for material analysis, quadrupole mass spectrometers and their special ion sources and optical systems, electron diffraction devices, pole-shoe plate covering in raster electron microscopes, image converters and image intensifiers, ion microprobes, X-ray source equipment and ultra-violet sources. In fact the invention is applicable to instruments which produce, process, transmit or utilize an electron or ion beam and the term electron or ion beam instrument is here used within this scope.

Referring now to the drawings in detail, FIG. 1 shows that the electron-energy analyzer consists of two coaxial cylinders which are accommodated in an evacuated housing, not illustrated. The outer cylinder 1 is connected to a direct-voltage source 2 and receives, superimposed upon the direct voltage, an alternating voltage from an alternating-voltage source 3. As a result, the electron beam, incident at $e^{31}$, after impinging on a specimen 4 is deflected as a primary beam towards the annular gap 9 and through the latter into the energy analyzer. The inner cylinder contains a partition 7 so that the primary electron beam 8 leaving the specimen cannot reach the SEV (secondary electron multiplier) directly. Thanks to the variable field construction with direct and alternating voltage sources, a lobar electron path develops in the analyzer which, beginning from above at the annular gap 5, penetrates through the space between the outer and inner cylinder and then reaches the SEV through the annular gap 10 of the inner cylinder and further through the diaphragm 15.

Figure 3:
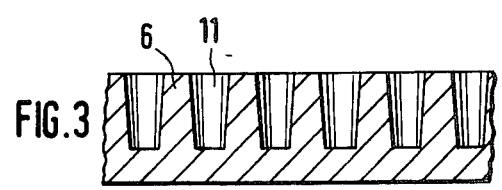
FIG. 3 shows the enlarged detail III of FIG. 1.

In the specific embodiment shown, the inner cylinder 6 may consist of a zirconium or titanium tube perforated by an electron beam. The inner cylinder 6 contains, at its outside, closely adjacent blind bores 11 (FIG. 3) which absorb the unwanted primary electrons sorted out by energy selection and other particles but do not alter the outer surface of the inner cylinder electron-optically so that the electron-optical characteristics of the analyzer are retained.

The apertures 9 and 10 which are provided over the periphery of the inner cylinder 6 at the upper and lower ends and which are comparatively large cannot be produced in the above-mentioned uniform microstructure because no reflections at walls of perforations are wanted at these points. For this reason, the relatively large apertures at the upper and lower ends of the inner cylinder are covered with a thin wire netting 14 of zirconium or titanium. This wire grating ensures that no unwanted field distortions occur. This wire grating is so thin that no reflections can occur as with the above-mentioned perforations.

Figure 2:
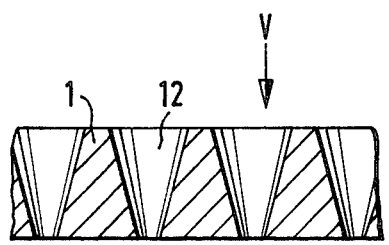
FIG. 2 shows the enlarged detail II of FIG. 1 in a section on the section line II—II of FIG. 5.

In contrast to the inner cylinder 6, the outer cylinder 1 of the electron-beam analyzer can be provided with through-perforations or through-holes 12 so that also the unwanted partial streams of particles released by the electron beam can migrate to the outside (FIGS. 2 and 6).

Figure 4:
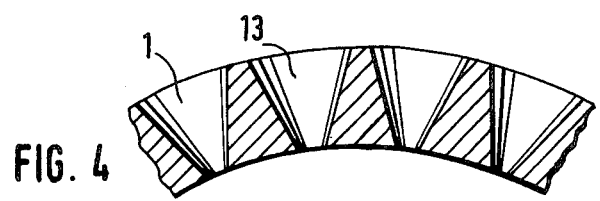
FIG. 4 shows the enlarged detail IV of FIG. 1.
Figure 5:
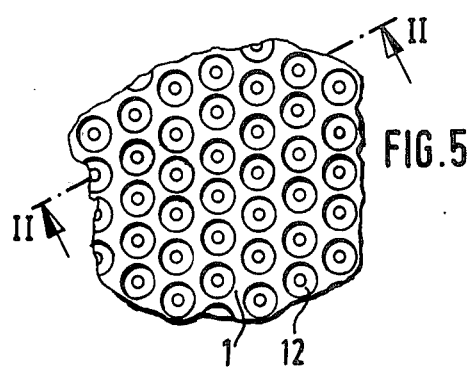
FIG. 5 shows a view in the direction of the arrow V of FIG. 2.

According to the invention, the partition 7 provided in the inner cylinder may likewise be made of zirconium or titanium sheet which is provided with blind holes 11 situated close beside one another at the side adjacent to the specimen 4. A second possibility consists in constructing the partition in the form hitherto customary and placing a plane or spherical zirconium or titanium disc 13 over this continuous wall, which disc can then be provided with through apertures 12 (FIG. 4).

According to the invention, all the surfaces seen by the beam are provided with through perforations or with blind holes. These above-mentioned surfaces include all the electrodes, screening plates, diaphragms or the like starting from the beam production to the beam reception. For example, according to the present invention, in a quadrupole analyzer, the four pole bars consisting of solid metal and the tube surrounding them can be produced from the said materials in the manner according to the invention and then receive blind holes close beside one another at their surface. It may be mentioned once again that, according to the proposals of the invention, not only are the unwanted secondary particle streams trapped but also the production of these secondary particle streams is very drastically reduced by the appropriate selection of material and the proposed surface structure. It is known that even carefully cleaned surfaces always have numerous surface coatings in the form of gases, lubricants, dust and the like. If, as was hitherto customary, other materials than those mentioned were to be used, there would be a great emission of secondary particle streams which, inter alia, would cause a deterioration in the vacuum locally, which now does not happen with the construction of the components in the form of an active system which improves the vacuum.

It may also be mentioned that the perforations provided according to the invention extend substantially perpendicular to the surface. As a result, there is an optimum ratio between the electron-optically effective surface and the total surface, that is to say outside face plus wall faces of the apertures. In this connection, it would be noted that practically all analyzers and similar devices have to be opened, that is to say freed of the vacuum, during the change of specimen and change of cathode or the like. In this ventilated stage, all the surfaces are covered and are only freed of gas again after the device has again been made ready for operation by applying a vacuum. The enlargement of the surface achieved by the perforations is just as large as is necessary for the intended effect of the device but not nearly so great that too large a labyrinth surface is obtained which is harmful to satisfactory working vacuum conditions and redundant, as with sintered particle traps.

Thus, the device according to the invention largely solves the problem of self-destruction of the parts seen by the primary beam by atomization with the associated short life in systems producing electron or ion beams. Nor is there any reduction in performance as a result of the sputter products moving with high energy in the path of rays. The problem of unstable power behavior is also solved, which problem is caused by the fact that the sputter products vaporizing on insulators alter the insulation values. Furthermore, the problem of interaction of the primary beam with sputter products and the surfaces seen by the beam is solved. In energy or mass analyzers, the problem of the secondary-secondary effects together with the problem of low transmission is solved. Thus there is a considerable improvement in the performance and in the signal-to-noise ratios in all systems producing or processing electron beams or ion beams.

It is, of course, to be understood that the present invention is, by no means, limited to the specific showing in the drawings, but also comprises any modifications within the scope of the appended claims.

What we claim is:

1. An electron or ion beam instrument wherein substantially all surfaces of the instrument adjacent the beam are formed from a metal having a low atomization rate and a very low desorption rate and are provided with closely spaced apertures of less than 0.5 mm diameter extending substantially perpendicular to the surface, the depth of the apertures being at least equal to their opening cross section and the total cross sectional area of the apertures corresponding to at least half of the metal surface in which they are provided.

2. An instrument according to claim 1, in which said metal is selected from the group consisting of titanium, zirconium, and an alloy containing at least one of these metals.

3. An instrument according to claim 1, wherein the apertures occupy 65 to 85% of the surface.

4. An instrument according to claim 1, wherein at least some of said apertures are blind holes.

5. An instrument according to claim 1, wherein said apertures are distributed hexagonally over the surface.

6. An instrument according to claim 1, wherein said apertures converge in directions away from the beam.

7. An instrument according to claim 1, wherein said apertures are produced by electron beams.

8. An instrument according to claim 1, wherein said apertures are produced by laser beams.

9. An arrangement for preventing the alteration of the primary beam by unwanted particles, such as sputter products, charged ions and electrons and their secondary processes and the resulting local improvement in the operational vacuum in electron-beam devices, ion-beam devices and in electron-energy analyzers and ion-mass analyzers, using only three-dimensional metallic microstructures known as particle traps, in which substantially all the flat parts of the components of the instrument seen by the beams, selected from the group consisting of electrodes, diaphragms, screening plates, housing walls, consist of a metal having a low atomization rate and a very low desorption rate, and in which apertures of less than 0.5 mm diameter, situated close beside one another and extending substantially perpendicular to the surface, are provided in the surfaces of the components of the instrument, between which apertures, a lattice structure remains located in the surface, the depth of the apertures being at least equal to their opening cross-section and the total cross-sectional area of the apertures corresponding to at least half the metal surface occupied thereby.

10. An arrangement according to claim 9, in which said metal is selected from the group consisting of titanium and zirconium, and their alloys.

* * * * *